(12) United States Patent
Tohkairin et al.

(10) Patent No.: US 7,087,845 B2
(45) Date of Patent: Aug. 8, 2006

(54) METAL CORE MULTILAYER PRINTED WIRING BOARD

(75) Inventors: Hiroshi Tohkairin, Isesaki (JP); Kenji Sakakibara, Kariya (JP); Hideki Kabune, Chiryuu (JP)

(73) Assignees: CMK Corporation, Tokyo (JP); Advics Co., Ltd., Kariya (JP)

( * ) Notice: Subject to any disclaimer, the term of this patent is extended or adjusted under 35 U.S.C. 154(b) by 0 days.

(21) Appl. No.: 10/508,538

(22) PCT Filed: Jan. 28, 2004

(86) PCT No.: PCT/JP2004/000748

§ 371 (c)(1),
(2), (4) Date: Sep. 27, 2004

(87) PCT Pub. No.: WO2004/068923

PCT Pub. Date: Aug. 12, 2004

(65) Prior Publication Data

US 2005/0145414 A1    Jul. 7, 2005

(30) Foreign Application Priority Data

Jan. 28, 2003  (JP) .............................. 2003-018544

(51) Int. Cl.
*H05K 1/00* (2006.01)
(52) U.S. Cl. ...................... 174/252; 174/260; 174/262; 361/704
(58) Field of Classification Search ................ 174/252, 174/255, 260, 262, 263, 264, 266; 361/760, 361/704, 792, 793, 794, 795
See application file for complete search history.

(56) References Cited

U.S. PATENT DOCUMENTS 4,410,927 A * 10/1983 Butt ........................... 361/720

(Continued)

FOREIGN PATENT DOCUMENTS

EP       1 261 028        11/2002

(Continued)

*Primary Examiner*—Ishwar (I. B.) Patel
(74) *Attorney, Agent, or Firm*—Oblon, Spivak, McClelland, Maier & Neustadt, P.C.

(57) ABSTRACT

The present invention is characterized in that in a metal-core multilayer printed wiring board (1) which is obtained by forming one or more of at least inner layers of a laminate having a insulating layer and a conductor layer stacked alternately from a metal plate and has the metal plate as a core, the metal plate (13) is disposed below a site on which a heating element (10) is to be mounted, a surface layer over which the heating element (10) is to be mounted is connected to the metal plate (13) of the inner layer via a BVH (12) and a heat radiation layer (14) is formed over the surface layer. The present invention makes it possible to efficiently radiate heat, which has been released from the heating element, to the outside of the printed wiring board without impairing the packaging density of circuits and at the same time, to mount another element on the side opposite to the side on which the heating element exists.

7 Claims, 4 Drawing Sheets

U.S. PATENT DOCUMENTS

| | | | |
|---|---|---|---|
| 5,509,200 A | * | 4/1996 | Frankeny et al. ............ 29/852 |
| 6,605,778 B1 | * | 8/2003 | Dorfler et al. ............ 174/52.1 |
| 6,696,643 B1 | * | 2/2004 | Takano ...................... 174/52.1 |
| 6,891,732 B1 | * | 5/2005 | Takano et al. .............. 361/783 |

FOREIGN PATENT DOCUMENTS

| | | |
|---|---|---|
| JP | 03-286590 | 12/1991 |
| JP | 7-106721 | 4/1995 |
| JP | 07-326866 | 12/1995 |
| JP | 09-036553 | 2/1997 |
| JP | 11-330708 | 11/1999 |
| JP | 2000-188359 | 7/2000 |
| JP | 2000-299564 | 10/2000 |

* cited by examiner

_US 7,087,845 B2_

METAL CORE MULTILAYER PRINTED WIRING BOARD

TECHNICAL FIELD

The present invention relates to a metal-core multilayer printed wiring board capable of efficiently releasing heat generated by a semiconductor element (which will hereinafter be called "heating element").

1. Background Art

Conventionally in such a metal-core multilayer printed wiring board, a plated through-hole formed to connect a conductor pattern on the surface of a printed board to a conductor pattern on the back side thereof has been used as a through-hole for heat radiation (for example, Japanese Patent Laid-Open No. Hei 9-148691). Another method for effecting heat radiation is a method of forming an inner layer circuit from a copper foil or a thin plated layer and connecting the inner layer circuit to a conductor circuit of a surface layer and a copper-plated blind hole (which will hereinafter be called "IVH") disposed in an inner layer (for example, Japanese Patent Laid-Open No. Hei 11-330708). Also proposed is a metal-core multilayer printed wiring board having a heat radiation structure in which heat released by electronic parts passes through an internal heat transfer layer via a copper-plated blind hole (which will hereinafter be called "BVH") made in an outer layer, and is then transmitted to a chassis (case) through a surface-layer dielectric layer (for example, Japanese Patent Laid-Open No. 2000-299564).

DISCLOSURE OF THE INVENTION

When heat is radiated via a plated through-hole, a heating element mounted on one side disturbs mounting of another element on the other side of the through-hole. In addition, another wiring cannot be disposed in the vicinity of the plated through-hole and this disturbs an increase in the wiring density. Moreover, it is impossible to improve heat radiation by increasing the number of plated through-holes, because when the number is increased, wiring while circumventing many through-holes is required. Even in a printed wiring board in which inner layer circuits are made of a copper foil or a thin plated layer and they are connected via IVH, this IVH connection is however not effective for heat transfer because a copper foil or plated layer is a thin metal. In a heat radiation structure for transferring heat from an internal heat transfer layer via BVH and then transmitting it to a chassis via a surface dielectric layer, a thermal conductivity of a resin which is an insulating material is low irrespective of the thinness of the surface dielectric layer and sufficient heat radiation effects cannot be expected.

With the forgoing problems in view, a first object of the present invention is to efficiently emit heat, which has been released by a heating element, to the outside of a wiring board, while a second object is to provide a metal-core multilayer printed wiring board permitting mounting of another element on the side of the wiring board opposite to the side on which the heating element exists (on the reverse side of the board).

The first object is achieved by, in a metal-core multilayer printed wiring board obtained by forming one or more of at least inner layers of a laminate having an insulating layer and a conductor layer stacked alternately from a metal plate and has the metal plate as a core, disposing the metal plate below a site on which a semiconductor element is to be mounted, and connecting a surface layer over which the semiconductor element is mounted and the metal plate as the inner layer via a BVH.

By such a structure, a heat radiation layer can be formed in a space of the surface layer other than that for signal circuits and portions on which parts are to be mounted so that heat emitted by the heating element can be released to the surface of the printed wiring board via the inner-layer metal plate. In addition, by the above-described structure, elements can be mounted on the side of the wiring board opposite to the side on which the heating element exists, which facilitates arrangement of parts, increases design freedom, and thereby enables effective use of the space of the wiring board. Thus, the second object can be attained.

The heat radiation effects can be enhanced further by filling the BVH with a material having a high thermal conductivity.

In particular, by disposing a ground layer at the periphery of the heat radiation layer of the surface layer and connecting the chassis to the ground layer after mounting of the heating element, heat which will otherwise remain in the wiring board for long hours can rapidly be emitted.

Heat radiation effects can be improved further by forming, on the heat radiation layer of the surface layer, a soldering pad for mounting the heating element and bonding the heating element to the surface layer via the soldering pad.

The present invention makes it possible to provide a metal-core multilayer printed wiring board capable of efficiently radiating heat, which has been released by a heating element, to the outside of the wiring board and permitting mounting of elements on the side of the wiring board opposite to the side on which the heating element exists without impairing the packaging density of circuits. This invention has a great industrial contribution.

LEGENDS

Figure 1:
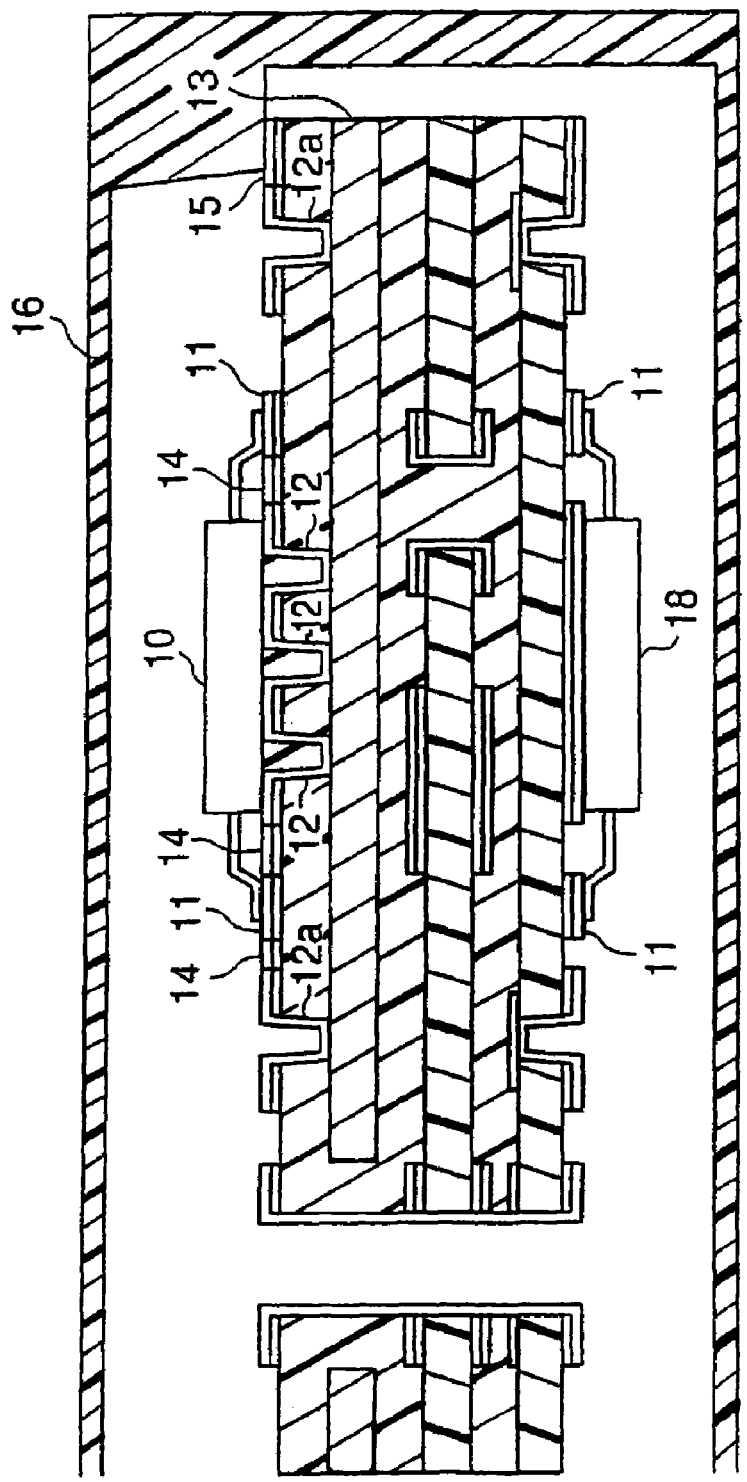
FIG. 1 is a schematic cross-sectional view of a metal-core multilayer printed wiring board according to the present invention.

1: Metal-core multilayer printed wiring board (Invention product 1)
2. Metal-core multilayer printed wiring board (Invention product 2)
10, 40: Heating element (semiconductor element)
11, 33, 41: Soldering pad
12, 12a, 34: BVH
13: Metal plate
14, 35: Heat radiation layer
15, 36: Ground layer
16: Chassis
17: Heat transfer material
18: Element (semiconductor element)

21: Electrolytic copper foil
22, 42: Prepreg
23: Rolled copper plate
24, 43: Glass epoxy copper clad laminate
25, 32, 44: Plated through-hole
26: Circuit
27: Laminate
28: Opening
29: Through-hole
30: Blind hole
31: Copper plating

BEST MODE FOR CARRYING OUT THE INVENTION

Embodiments of the present invention will hereinafter be described specifically based on accompanying drawings.

FIG. 1 is a schematic cross-sectional view illustrating the constitution of the metal-core multilayer printed wiring board according to the embodiment of the present invention. In this diagram, a heating element 10 is mounted on a soldering pad 11 of a metal-core multilayer printed wiring board 1 having a metal plate 13 as a core of inner layers of a laminate having a dielectric layer and a conductor layer stacked alternately.

Under the heating element 10, a BVH 12 is formed and at the same time, a BVH 12a is formed not under but below the heating element. The heating element 10 is connected to the metal plate 12 of the inner layer via the BVH 12, while the BVH 12a and heat radiation layer 14, and moreover, the ground layer 15 at the periphery thereof are electrically connected via the metal plate 13. This heat radiation layer 14 is disposed as a solid pattern making use of a space other than a signal circuit (not illustrated) which is a conductor circuit of a surface layer and a soldering pad and it functions as a ground circuit. The ground layer 15 at the periphery of the heat radiation layer is connected to a chassis 16.

An element 18 is mounted on the soldering pad 11 on the side of the metal-core multilayer printed wiring board 1 opposite to the side on which the heating element 10 exists.

Below the heating element 10, the BVH 12 is formed. Arrangement of the BVH 12 just below the heating element is preferred for improving heat radiation.

A description will next be made of the effects of the metal-core multilayer printed wiring board according to the above-described embodiment. The heat generated in the heating element 10 of FIG. 1 reaches the metal plate 13 of the inner layer via the BVH 12 formed under the heating element. The heat passes through the metal plate 13, is transferred and released to the BVH 12a and heat radiation layer 14, passes through the ground layer 15 and the chassis 16 connected thereto and then is radiated rapidly outside.

By the above-described structure, the element 18 can be mounted on the side of the printed wiring board opposite to the side on which the heating element 10 exists, which facilitates the arrangement of parts, increasing design freedom, and thereby enables effective use of the space of the board.

Figure 2:
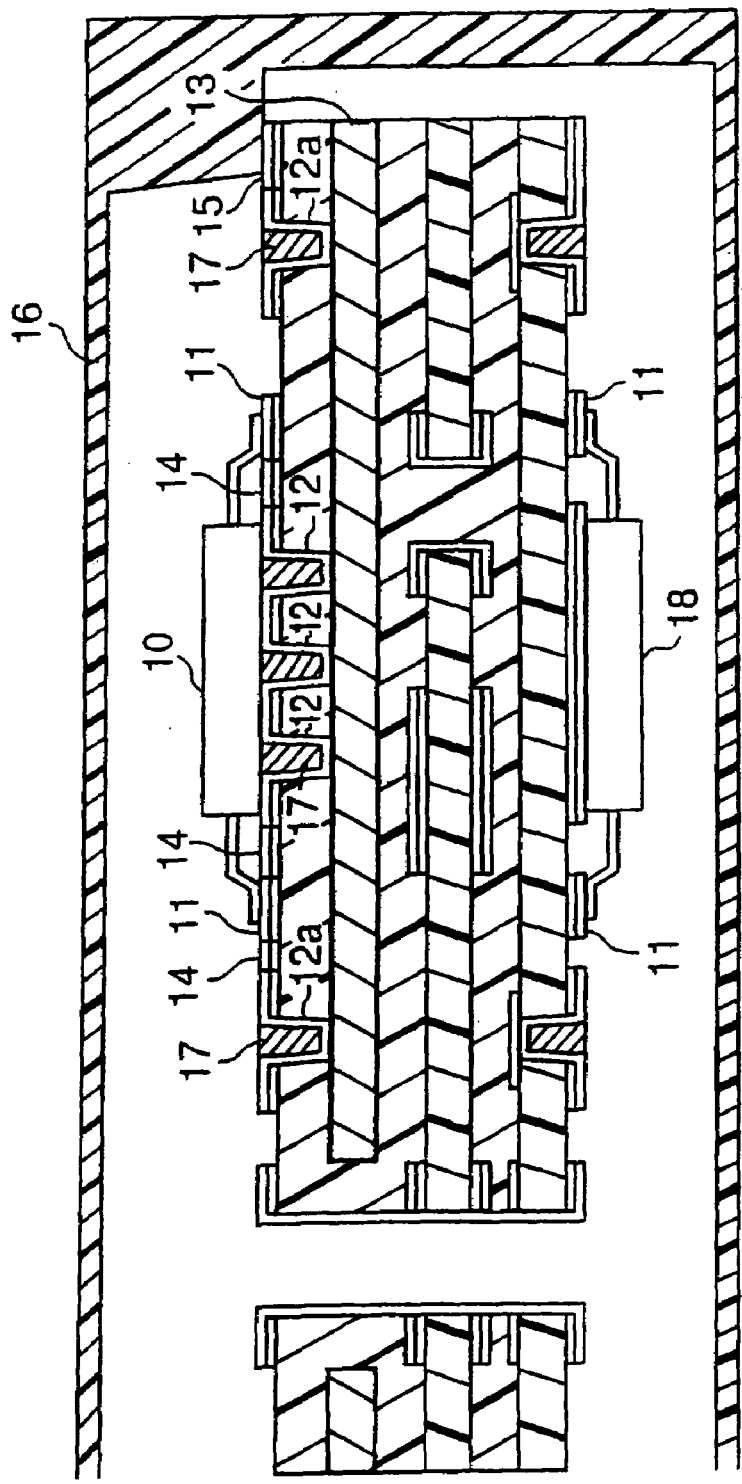
FIG. 2 is a schematic cross-sectional view of another metal-core multilayer printed wiring board according to the present invention.

FIG. 2 is a schematic cross-sectional view for explaining the constitution of the metal-core multilayer printed wiring board according to the embodiment of the present invention having BVHs 12 and 12a filled with a heat conductive material 17 having a high heat conductivity.

As the heat conductive material 17, materials having a high heat conductivity, including metals such as copper and solder, and resin pastes obtained by mixing an inorganic material, for example, ceramic particles (alumina, silica) with a resin are preferred.

According to this embodiment, the BVHs 12 and 12a are filled with the heat conductive material 17 so that heat is transmitted to a more volume, resulting in a further improvement in heat radiation effects.

The fabrication examples of the metal-core multilayer printed wiring board of the present invention will next be described in detail referring to FIGS. 3 and 4.

FABRICATION EXAMPLE 1

Figure 3A:
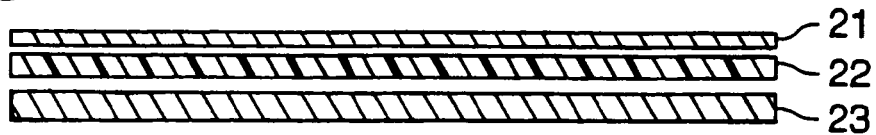
FIG. 3 is a schematic cross-sectional for explaining the fabrication steps (a) to (d) of the metal-core multilayer printed wiring board of the present invention.

As illustrated in FIG. 3(a), an electrolytic copper foil 21 having a thickness of 18 μm, a prepreg 22 having a pre-lamination thickness of 60 μm and a rolled copper sheet 23 having a thickness of 250 μpm were stacked one after another. As illustrated in the laminate 27 of FIG. 3(c), only the rolled copper sheet side was etched to simultaneously form an opening 28 wider than the diameter of a through-hole 29, which was formed in the later step, and circuit patterns (not illustrated).

Figure 3B:
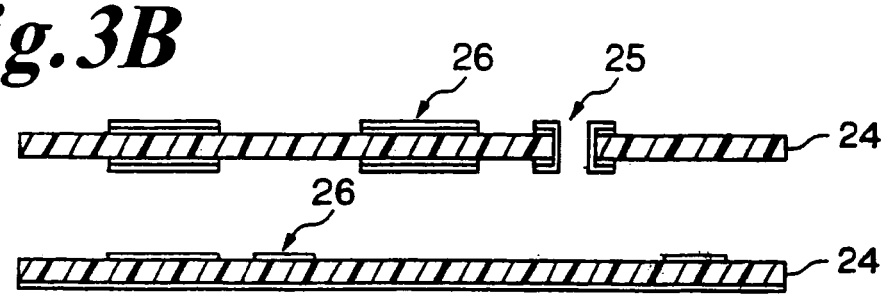

As illustrated in FIG. 3(b), after formation of a through-hole in one of two double-sided copper clad glass epoxy laminates 24 with an electrolytic copper foil having a thickness of 18 μm, a plated through-hole 25 was formed by copper plating. Circuits 26 were then formed by the photographic method. With regards to the other copper-clad glass epoxy laminate 24 with an electrolytic copper foil having a thickness of 18 μm,. circuits 26 were formed only on one side thereof by the photographic method.

Figure 3C:
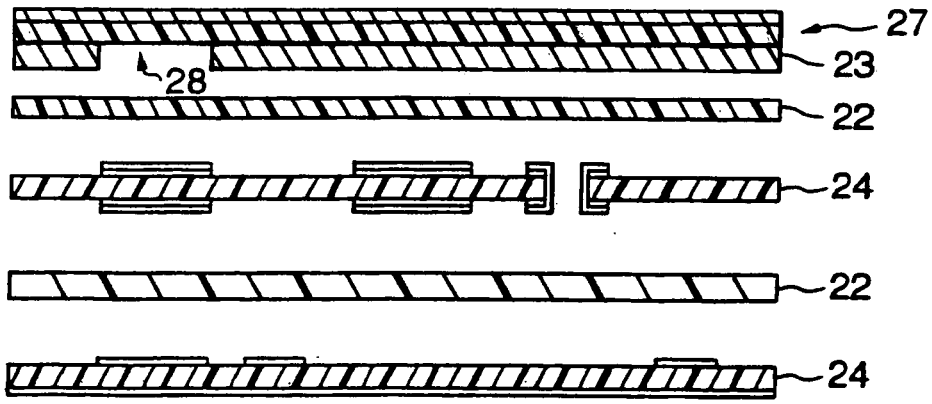

As illustrated in FIG. 3(c), the substrates obtained in FIGS. 3(a) and 3(b) were stacked one after another using a prepreg 22.

Figure 3D:
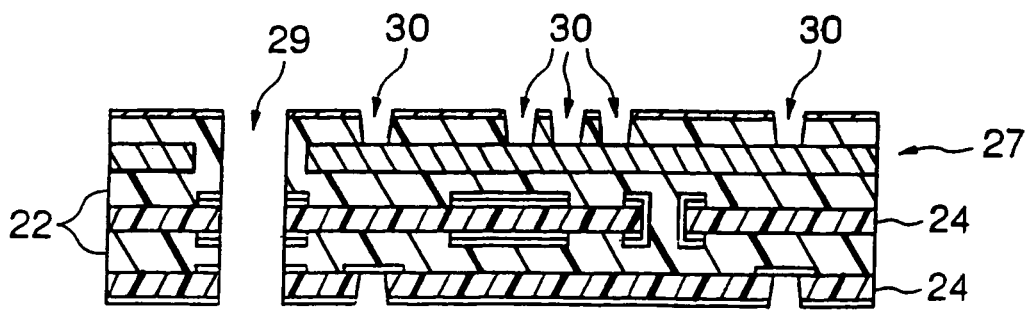

As illustrated in FIG. 3(d), a through-hole 29 was then drilled in the resulting stack, while a blind hole 30 was formed in the surface layer by laser.

Figure 4E:
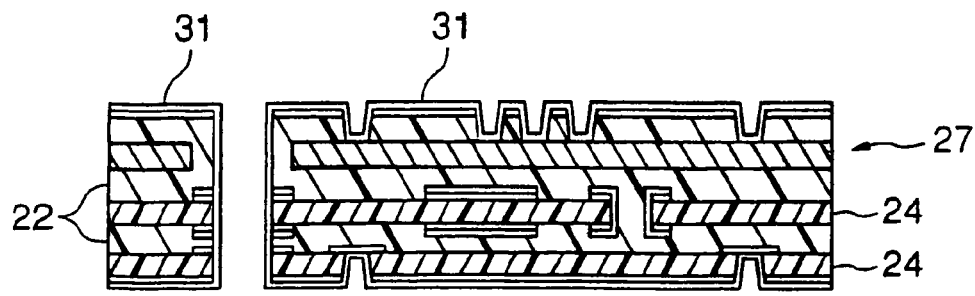
FIG. 4 is a schematic cross-sectional view for explaining the fabrication steps (e) to (f) of the metal-core multilayer printed wiring board of the present invention.

As illustrated in FIG. 4(e), copper plating 31 was applied to the through-hole 29 and blind hole 30.

Figure 4F:
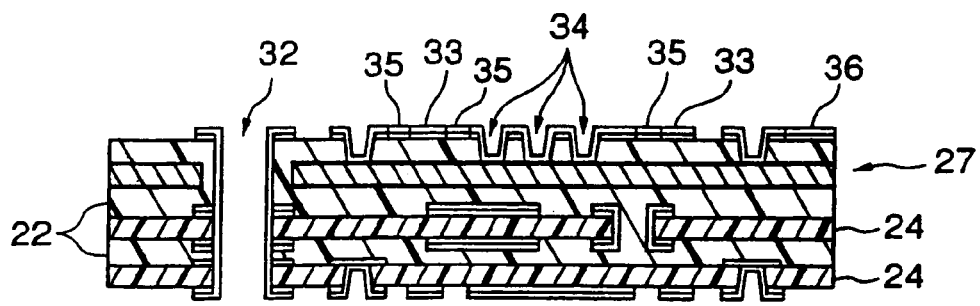

As illustrated in FIG. 4(f), circuits were formed over the surface layer by the photographic method, whereby the metal-core multilayer printed wiring board (invention product 1) having the plated through-hole 32, BVH 34, soldering pad 33 and peripheral ground layer 36 was fabricated.

FABRICATION EXAMPLE 2

In a similar manner to Example 1 except that after formation of the blind hole 30 in a surface layer by laser, the BVH 12 was filled with copper plating, a metal-core multilayer printed wiring board (invention product 2) having a BVH filled with a heat conductive material (copper) was obtained.

Conventional Product

Figure 5:
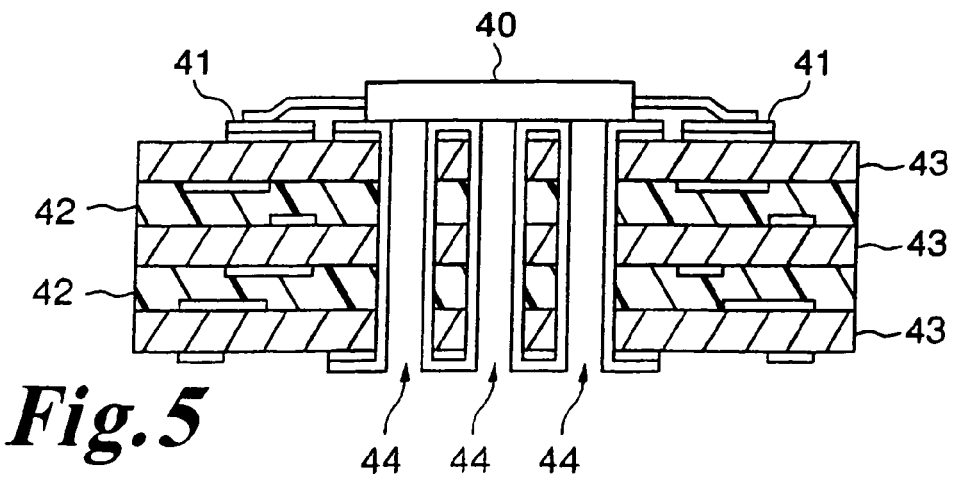
FIG. 5 is a schematic cross-sectional view for explaining a conventional printed wiring board.

Three copper-clad glass epoxy laminates 43 with an electrolytic copper foil having a thickness of 18 μm were prepared. They were stacked one after another by using a prepreg 42. A through-hole was drilled in the laminate, followed by copper plating. A soldering pad 41 for mounting parts thereon was formed on the surface layer of the plated through-hole 44. A heating element 40 was mounted on the soldering pad 41, whereby the six-layer printed wiring board (conventional product) as illustrated in FIG. 5 was obtained.

Test

On almost the center of each of the invention products 1 and 2 fabricated by the above-described process (the diameter of BVH of each product is 00.15 mm) and the six-layer printed wiring board (size: 180×93 mm) as the conventional product, four ICs which were heating elements were mounted. A stress of 3W, totally 12W, was applied to it for 5 minutes.

The comparison results of the surface temperature of the IC are shown in Table 1.

TABLE 1

|  | Constitution of substrate | Surface temperature (° C.) of IC |
|---|---|---|
| Invention product 1 | Metal core six-layer printed wiring board | 86 |
| Invention product 2 | Metal core six-layer printed wiring board (copper-filled BVH) | 79 |
| Conventional product | Six layer printed wiring board | 102 |

It has been confirmed from the test results of Table 1 that the surface temperature (86° C.) of IC mounted on the invention product 1 is lower than that (102° C.) on the conventional product so that the invention product 1 has improved heat radiation effects. It has also been confirmed that the surface temperature (79° C.) of IC mounted the invention product 2 having a BVH filled with a heat conductive material is lower than that (86° C.) mounted on the invention product 1 and the invention product 2 has further improved heat radiation effects.

The invention claimed is:

1. A metal-core multilayer printed wiring board comprising: a surface layer over which a semiconductor element is to be mounted; a metal plate as a core, disposed below a site on which the semiconductor element is to be mounted and below the surface layer as an inner layer; at least one inner layer of a laminate having an insulating layer and a conductor layer stacked alternately from the metal layer; a heat radiation layer formed over the surface layer: and a first blind via hole formed in the surface layer under but not below the site on which the semiconductor element is to be mounted and a second blind via hole formed in the surface layer below the site on which the semiconductor element is to be mounted, the semiconductor element and the heat radiation layer connected to the metal plate by the blind via holes; wherein a ground layer is disposed at the periphery of the heat radiation layer over the surface layer and connected to a chassis after mounting of the semiconductor element.

2. The metal-core multilayer printed wiring board of claim 1, wherein the blind via holes have been filled with a heat conductive material.

3. The metal-core multilayer printed wiring board of claim 2, wherein a ground layer is disposed at the periphery of the heat radiation layer over the surface layer and connected to a chassis after mounting of the semiconductor element.

4. The metal-core multilayer printed wiring board of claim 3, wherein the heat radiation layer over the surface layer is equipped with a soldering pad for mounting the semiconductor element, and the semiconductor element is bonded to the surface layer via the soldering pad.

5. The metal-core multilayer printed wiring board of claim 2, wherein the heat radiation layer over the surface layer is equipped with a soldering pad for mounting the semiconductor element, and the semiconductor element is bonded to the surface layer via the soldering pad.

6. The metal-core multilayer printed wiring board of claim 1, wherein the heat radiation layer over the surface layer is equipped with a soldering pad for mounting the semiconductor element, and the semiconductor element is bonded to the surface layer via the soldering pad.

7. The metal-core multilayer printed wiring board of claim 1, wherein the heat radiation layer over the surface layer is equipped with a soldering pad for mounting the semiconductor element, and the semiconductor element is bonded to the surface layer via the soldering pad.

* * * * *